(12) United States Patent
Fu

(10) Patent No.: US 7,935,606 B2
(45) Date of Patent: May 3, 2011

(54) TRANSISTOR MANUFACTURE

(75) Inventor: Jun Fu, Beijing (CN)

(73) Assignee: X-Fab Semiconductor Foundries AG (DE)

( * ) Notice: Subject to any disclaimer, the term of this patent is extended or adjusted under 35 U.S.C. 154(b) by 380 days.

(21) Appl. No.: 11/911,736

(22) PCT Filed: Apr. 18, 2006

(86) PCT No.: PCT/EP2006/061643
§ 371 (c)(1),
(2), (4) Date: May 21, 2008

(87) PCT Pub. No.: WO2006/111530
PCT Pub. Date: Oct. 26, 2006

(65) Prior Publication Data
US 2008/0305602 A1    Dec. 11, 2008

(30) Foreign Application Priority Data

Apr. 18, 2005 (GB) .................................. 0507772.2

(51) Int. Cl.
*H01L 21/331* (2006.01)
*H01L 21/8222* (2006.01)
(52) U.S. Cl. ........ 438/366; 438/312; 438/320; 438/364; 438/365
(58) Field of Classification Search .................. 438/312, 438/320, 364–366
See application file for complete search history.

(56) References Cited

U.S. PATENT DOCUMENTS

| 5,118,634 | A | 6/1992 | Neudeck et al. |
| 6,440,810 | B1 | 8/2002 | Johansson et al. |
| 6,657,242 | B1 * | 12/2003 | Norstrom et al. ............. 257/197 |
| 2003/0119249 | A1 * | 6/2003 | Swanson et al. ............. 438/234 |
| 2004/0082135 | A1 | 4/2004 | Chuang |
| 2005/0073026 | A1 | 4/2005 | Lojek |

FOREIGN PATENT DOCUMENTS

WO    03/009353    1/2003

OTHER PUBLICATIONS

International Search Report issued regarding International Application No. PCT/EP2006/061643 (Aug. 11, 2006).

(Continued)

*Primary Examiner* — Michael S Lebentritt
*Assistant Examiner* — Karen M Kusumakar
(74) *Attorney, Agent, or Firm* — Thompson Hine LLP

(57) ABSTRACT

A method in which an oxide layer is formed on material defining and surrounding an emitter window. The technique comprises depositing a non-conformal oxide layer on the surrounding material and in the emitter window, whereby the thickness of at least a portion of the oxide layer in the emitter window is smaller than the thickness of the oxide layer on the surrounding material outside the emitter window; and removing at least a portion of the oxide layer in the emitter window so as to reveal at least a portion of the bottom of the emitter window whilst permitting at least a portion of the oxide layer to remain on the surrounding material. The technique can be used in the manufacture of a self-aligned epitaxial base BJT (bipolar junction transistor) or SiGe HBT (hetero junction bipolar transistor).

17 Claims, 7 Drawing Sheets

OTHER PUBLICATIONS

Wolf, S. et al., "Silicon Processing for the VLSI Era,", vol. 1: Process Technology, pp. 185-187, Lattice Press, Sunset Beach, California.

Glenn, J.L. et al., "High-Speed Fully Self-Aligned Single-Crystal Contacted Silicon Bipolar Transistor," Electronic Letters, IEE Stevenage, GB, vol. 26, No. 20, pp. 1677-1679 XP000109428, ISSN: 0013-5194 (Sep. 27, 1990).

Isaac, R.D. et al., Method for Fabricating IBM Technical Disclosure Bulletin, IBM Corp., New York, US vol. 22, No. 84, pp. 3393-3396 (Jan. 1980) XP000806500, ISSN: 0018-8689.

Ning, T.H. et al., "Bipolar Transistor Structure," IBM Technical Disclosure Bulletin, IBM Corp., New York, US vol. 21, No. 2, pp. 846-849 (Jul. 1978) XP002016733, ISSN: 0018-8689.

* cited by examiner

TRANSISTOR MANUFACTURE

The present invention relates to improvements in transistor manufacture. The invention finds particular application in the manufacture of a bipolar junction transistor (BJT) or a hetero junction bipolar transistor (HBT). Whilst not limited thereto, the invention is particularly useful in the manufacture of a self-aligned epitaxial base BJT or SiGe HBT.

BACKGROUND

In some transistor manufacturing processes an emitter window is formed, and it is then desired to form an oxide layer on material surrounding the emitter window, whilst it is also desired that the bottom of the emitter window is not covered by the oxide layer. Complicated processes are known in the art which aim to achieve this.

SUMMARY

In one embodiment, the present inventor has devised a novel method of providing an oxide layer on material surrounding an emitter window whilst ensuring that at least a portion of the bottom of the emitter window is not covered by the oxide layer.

One or more aspect(s) is/are set out in the independent claim(s).

BRIEF DESCRIPTION OF THE DRAWINGS

A preferred embodiment of the invention will now be described by way of example only and with reference to the accompanying drawings, in which.

DETAILED DESCRIPTION

The principle of the present invention will now be illustrated with reference to the manufacture of a self-aligned epitaxial base BJT, but it will be understood that the invention is not limited thereto.

Figure 1:
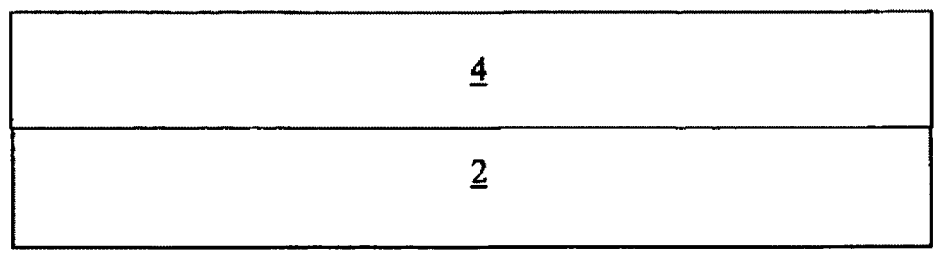
FIG. 1 shows a first step of a processing sequence according to an embodiment of the invention.

As shown in FIG. 1, a heavily doped n+ buried layer 2, which serves as the sub-collector, is provided. A n-type Si epitaxial layer 4, which acts as a collector, is grown on the heavily doped n+ buried layer 2.

Figure 2:
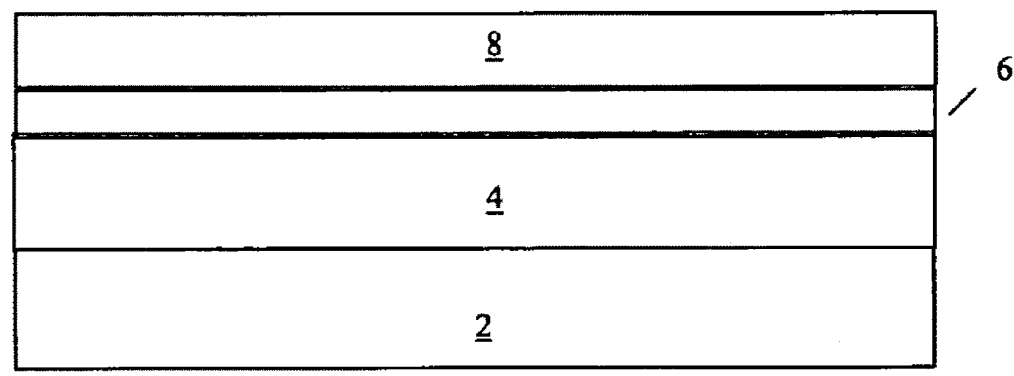
FIG. 2 shows a second step of a processing sequence according to an embodiment of the invention.

As shown in FIG. 2, silicon oxide is deposited so as to form a pad oxide layer 6 on the n-type Si epitaxial layer 4. Subsequently a poly Si layer 8 is deposited on pad oxide layer 6, which poly Si layer 8 is then p-type heavily doped by high dose ion implantation.

Figure 3:
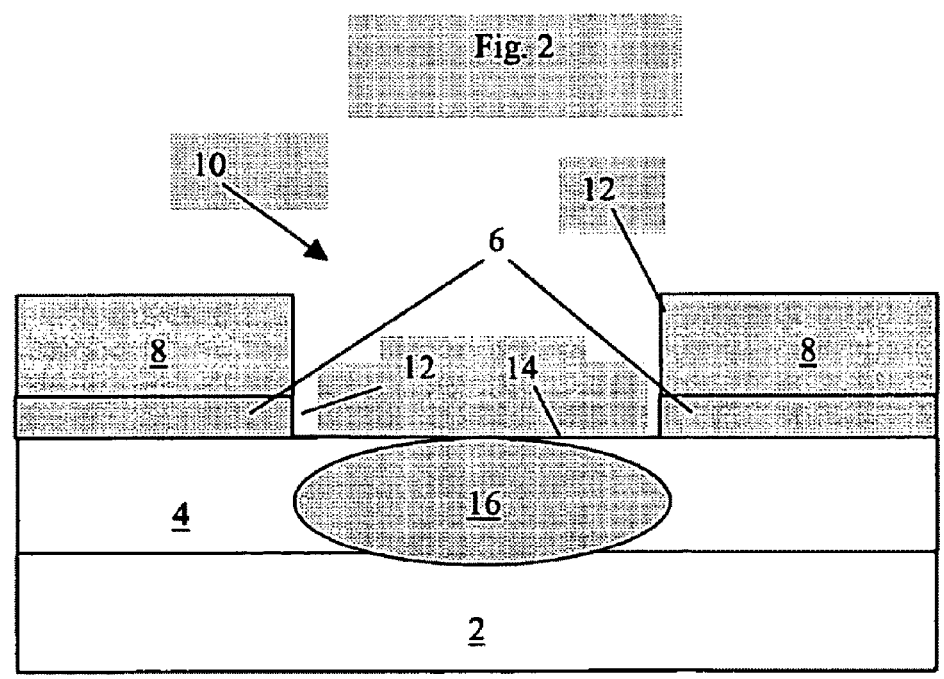
FIG. 3 shows a third step of a processing sequence according to an embodiment of the invention.

As shown in FIG. 3, an opening 10 is etched into the p+ poly Si layer 8 and pad oxide layer 6. The opening 10 can be generally of rectangular cross section as shown in FIG. 3, with side walls 12 and bottom portion 14. Other geometries are also possible. A SIC 16 (selectively ion-implanted collector) is then formed primarily in n-type Si-epitaxial layer 4 by ion implantation through the opening 10.

Figure 4:
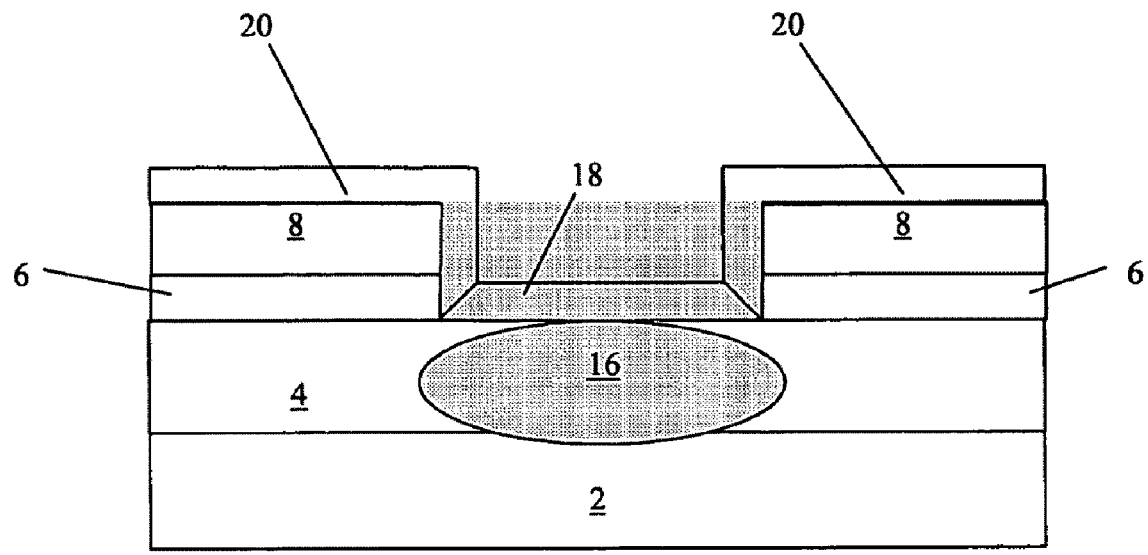
FIG. 4 shows a fourth step of a processing sequence according to an embodiment of the invention.

As shown in FIG. 4, a Si epitaxial layer 18 is then grown on the bottom portion 14 of the opening 10 so as to form a base material. A corresponding polycrystalline layer 20 is also deposited on top of poly Si layer 8 and on side wall 12 formed by the poly Si layer 8 and the pad oxide layer 6. As a result of subsequent thermal cycles, the polycrystalline layer 20 will be p-type heavily doped by dopant-diffusion from poly Si layer 8. Eventually, layers 20 and 8 will constitute an extrinsic base layer.

Figure 5:
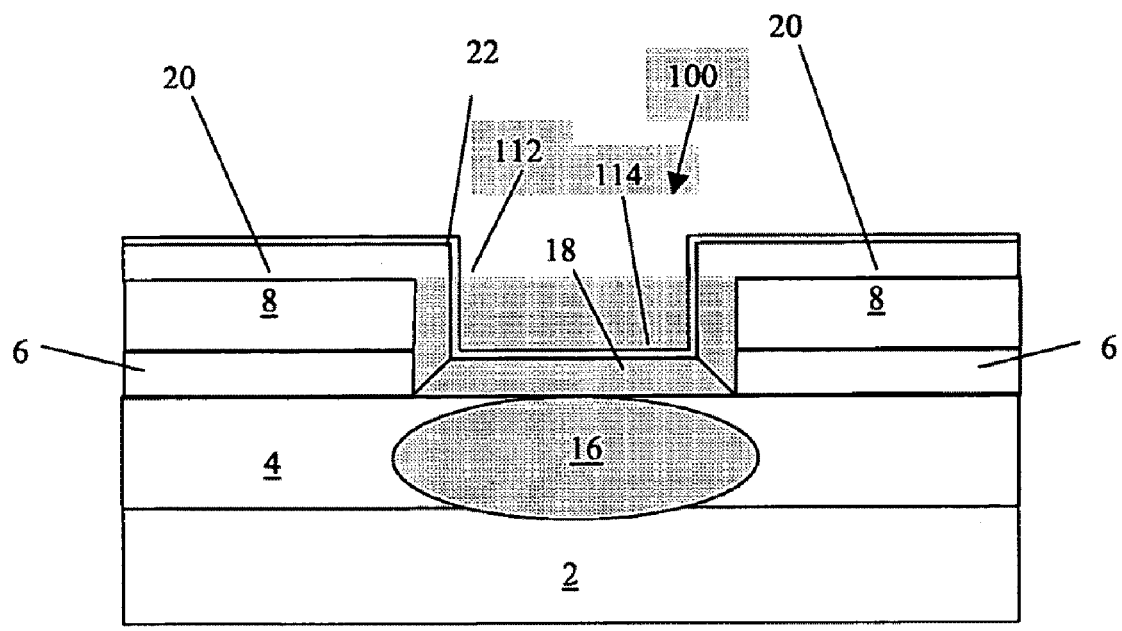
FIG. 5 shows a fifth step of a processing sequence according to an embodiment of the Invention.

As shown in FIG. 5, a thin silicon oxide layer 22 is then thermally grown on Si epitaxial layer 18 and extrinsic base layer 20 so as to form a surface passivation layer.

The opening resulting after the forming of oxide layer 22 will be referred to as emitter window 100. This has a bottom portion 114 and side walls 112, as shown in FIG. 5.

Figure 6:
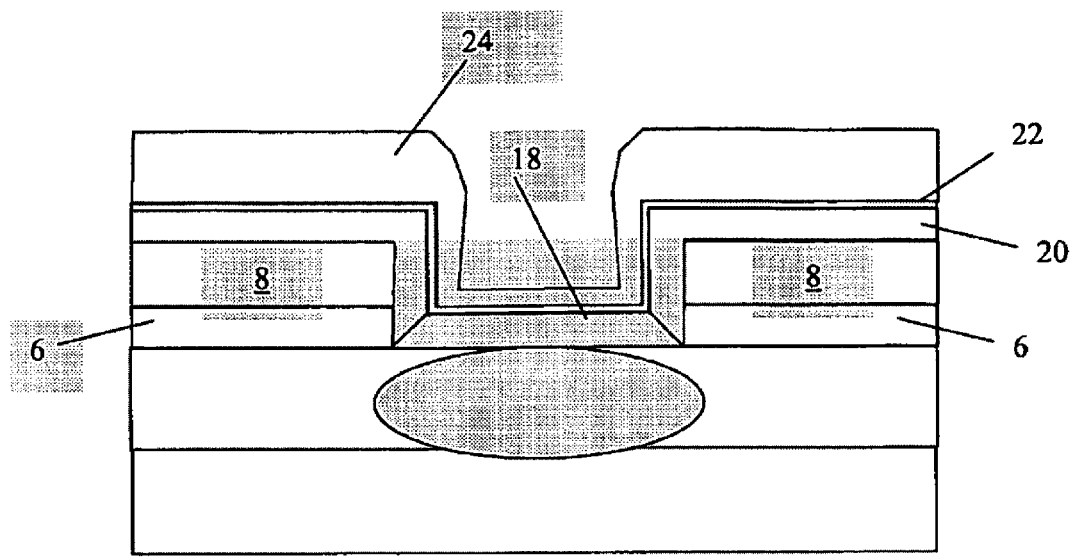
FIG. 6 shows a sixth step of a processing sequence according to an embodiment of the invention.

As shown in FIG. 6, an intentionally non-conformal silicon oxide cap layer 24 is then deposited on surface passivation layer 22 so as to form a dielectric layer inside the emitter window 100 and on the material surrounding the emitter window. This dielectric layer 24 is thinner inside the emitter window than outside the emitter window. Preferably, at least over a portion of the bottom 114 of the emitter window 100 the dielectric layer is thinner than outside the emitter window. Preferably, the dielectric layer 24 is thinner substantially over the entire bottom portion 114 of the emitter window than over the material (immediately) surrounding the emitter window.

A technique of non-conformal coverage of a step with an $SiO_2$ film using a depositer has been disclosed on pages 185-187 of "Silicon Processing for the VLSI Era", Volume 1: Process Technology, by S. Wolf and R. N. Tauber, Lattice Press, Post Office Box 340, Sunset Beach, Calif. 90742, USA. the entire contents of which are hereby incorporated by reference. This technique can be applied to the present invention, subject to any necessary modifications, which will be clear to one skilled in the art.

Preferably, the oxide cap layer 24 is about 50 to 300% thicker outside the emitter window than inside the emitter window. More preferably, the oxide cap layer 24 is about 100 to 200% thicker outside the emitter window than inside the emitter window. For example, the thickness of oxide cap layer 24 at the bottom of the emitter window may be 100 mm and outside the emitter window the thickness may be 200-300 mm when cap layer 24 has been deposited.

Figure 7:
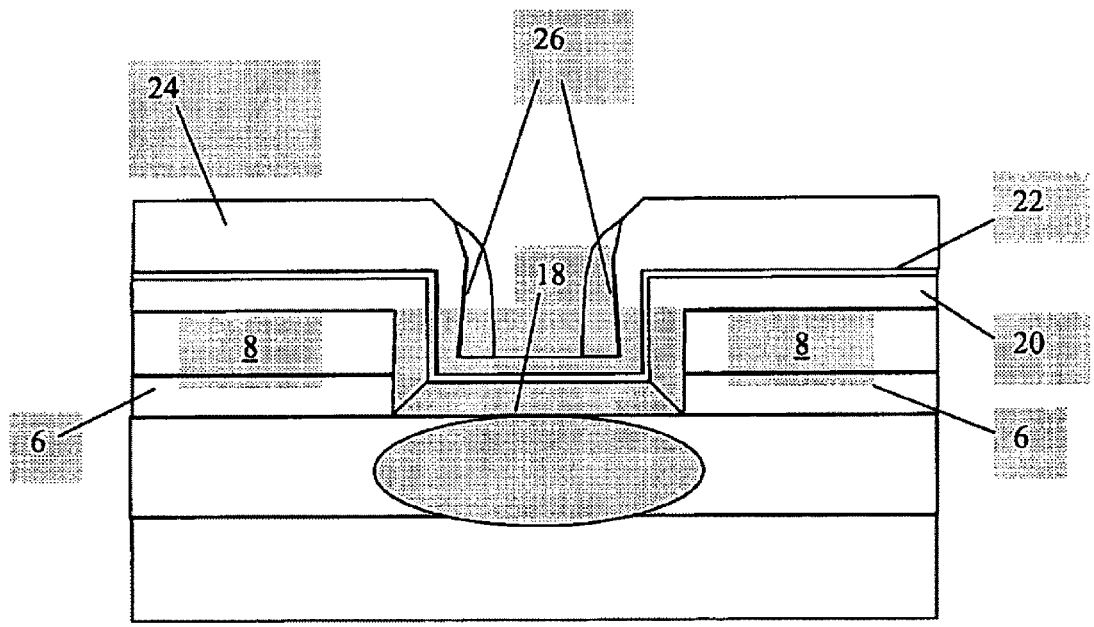
FIG. 7 shows a seventh step of a processing sequence according to an embodiment of the invention.

As shown in FIG. 7, nitride side wall spacers 26 are then created along the side walls 112 of the emitter window 100. This can be achieved by depositing a nitride layer and subsequently performing an etch-back.

Figure 8:
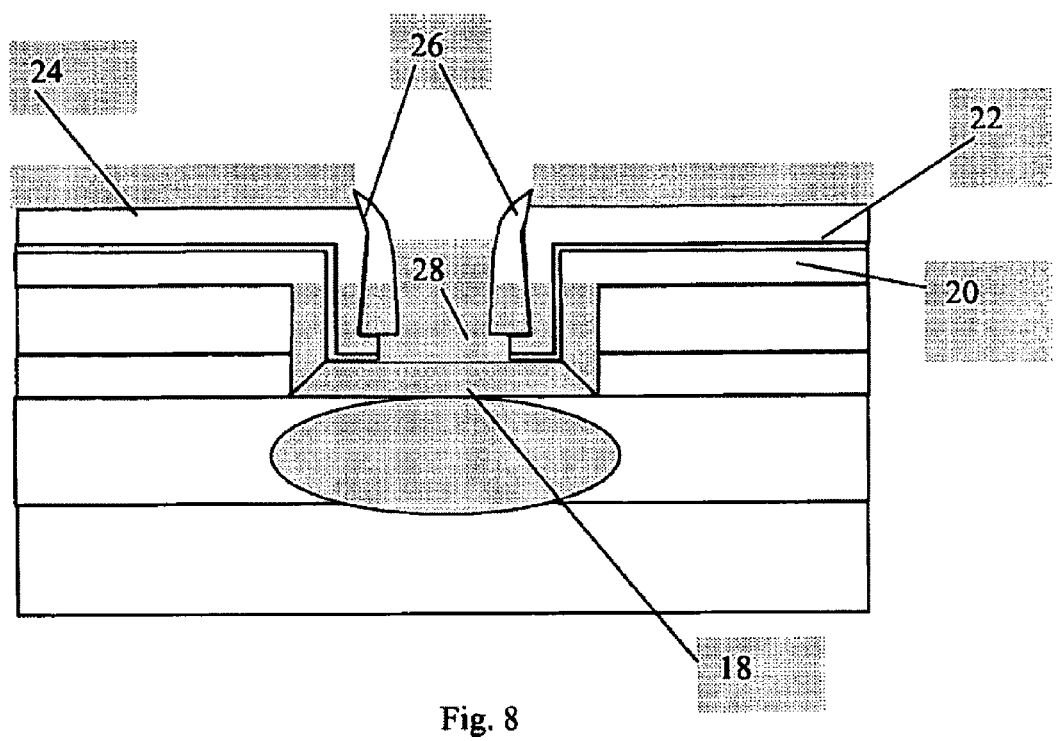
FIG. 8 shows an eighth step of a processing sequence according to an embodiment of the invention.

As shown in FIG. 8, a HF wet etch is then carried out using a wet etcher or remover. This removes the cap oxide layer 24 and surface passivation layer 22 at least at a central portion 28 of the emitter window 100, i.e. where, due to the non-conformality, the silicon oxide cap layer 24 is thinner than in other regions. During this HF wet etch the silicon oxide cap layer 24 is also etched outside the emitter window, i.e. on the material surrounding the emitter window, but a sufficiently thick portion of the cap oxide layer 24 remains on top of the p+polycrystalline layer 20. Preferably the HF wet etch is stopped as soon as substantially all of the silicon oxide cap layer 24 and surface passivation layer 22 has been removed between the nitride side wall spacers, although the HF wet etch may also continue until a small portion of surface passivation layer 22 and silicon oxide cap layer 24 has been removed from "under" the nitride side wall spacers. As shown in FIG. 8, a structure results which has the Si epitaxial layer 18 exposed (at least partially) and which is formed with a sufficiently thick cap oxide layer 24 and surface passivation layer 22 outside the emitter window 100. Preferably, the combined thickness of cap oxide layer 24 and passivation layer 22 remaining outside the emitter window 100 is at least 50 nm, preferably 50-150 nm, more preferably 80-120 nm and most preferably about 100 nm.

Preferably, the etch rate in the emitter window 100 is the same as outside the emitter window.

Figure 9:
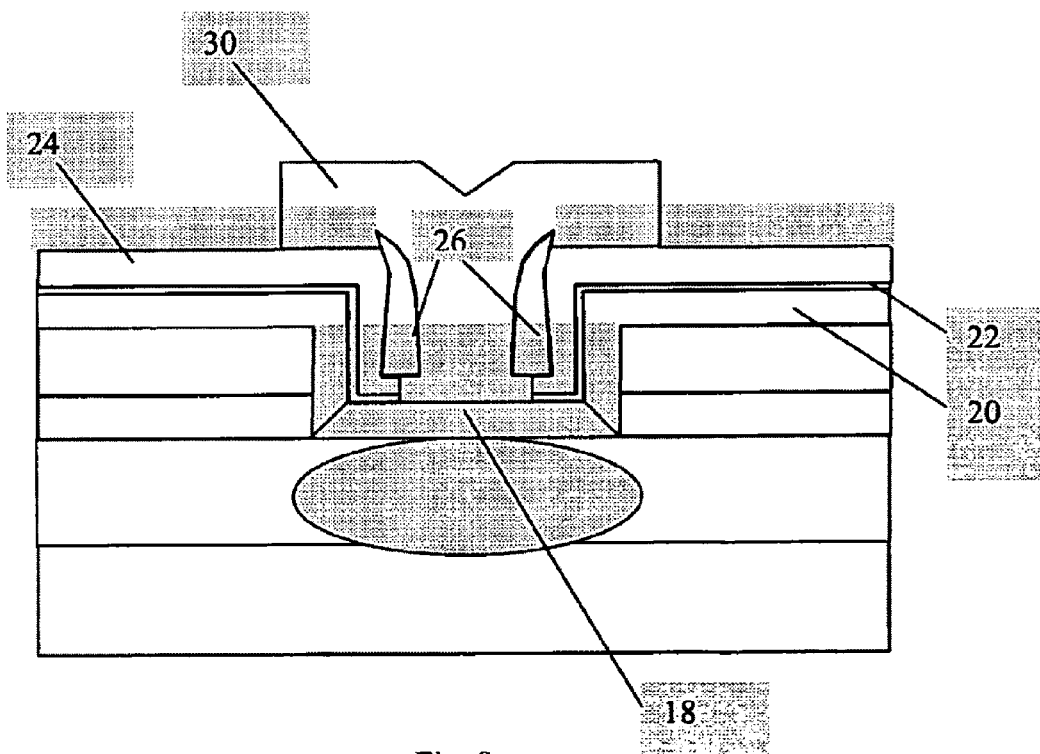
FIG. 9 shows a ninth step of a processing sequence according to an embodiment of the invention.

As shown in FIG. 9, the emitter poly 30 is then deposited, doped (in this example it is heavily n+ doped in situ during deposition) and patterned. The doping could alternatively be carried out by ion implant. Due to the oxide/nitride side wall spacers (note that now part of oxide layer 24 and passivation layer 22 can be regarded as forming part of the (oxide/nitride) side wall spacers) and the sufficiently thick cap oxide layer 24 remaining between the emitter poly material 30 and the extrinsic base poly material 20 and 8 it is possible to keep the emitter-base capacitances sufficiently low.

Figure 10:
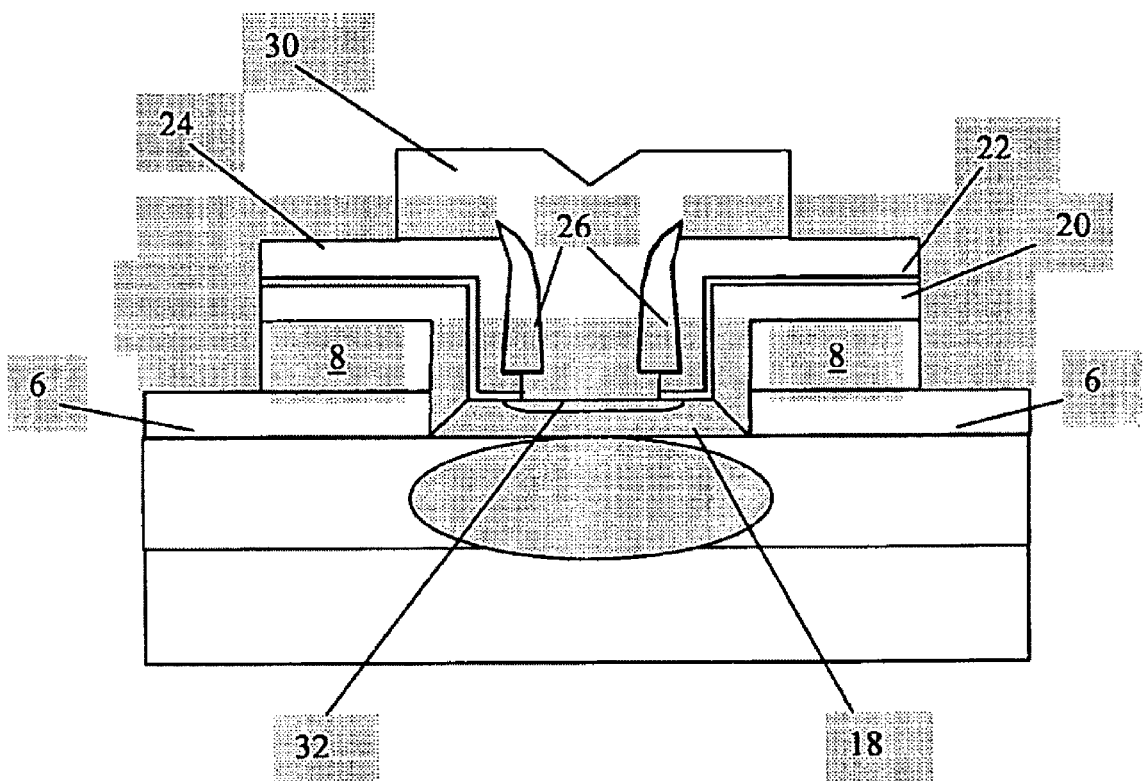
FIG. 10 shows a tenth step of a processing sequence according to an embodiment of the invention.

As shown in FIG. 10, the p+ extrinsic base poly layer 8 is patterned, and this is followed by an emitter drive-in anneal. This results in dopant out-diffusion from the emitter poly 30, which in turn results in the formation of an intrinsic emitter 32, at the bottom portion of emitter window 100. The p+ extrinsic base 20 and 8 is spaced from the emitter edge by means of the oxide/nitride side wall spacer in a self-aligned manner. The spacing is preferably chosen relatively small so that extrinsic base resistances are kept small. However, the spacing is preferably chosen large enough so that breakdown and leakage between emitter and extrinsic base is avoided.

Finally, the manufacture of the self-aligned epitaxial base BJT is completed by conventional backend processes, including the forming of contacts and vias, and metallization steps.

The invention is also applicable to the manufacture of a HBT, such as a SiGe HBT. In this case the epitaxial layer 18 which is grown as base material (see FIG. 4) is a Si/SiGe/Si epitaxial stack layer.

Whilst in the specific description reference has been made to a NPN BJT, the invention is also applicable to a PNP BJT. Any necessary modifications will be clear to one skilled in the art.

Whilst in the above detailed description of a preferred embodiment it is stated that the opening shown in FIG. 5 is an emitter window it will be appreciated that an emitter window can be formed by processes other than the technique described with reference to FIGS. 1 to 5. It will further be appreciated that during the wet etch shown in FIG. 8 the emitter window 100 changes in form. Nevertheless, the opening shown in FIG. 8 is still to be regarded as an emitter window, and it is intended that the term "emitter window" as used in the claims will be interpreted in a similarly "flexible" manner.

A preliminary experiment was carried out, using a short cycle lot, to demonstrate the feasibility of the deposition and the subsequent wet etch-back of the non-conformal oxide for realising a self-aligned SiGe HBT device architecture according to an embodiment of the invention.

Figure 11:
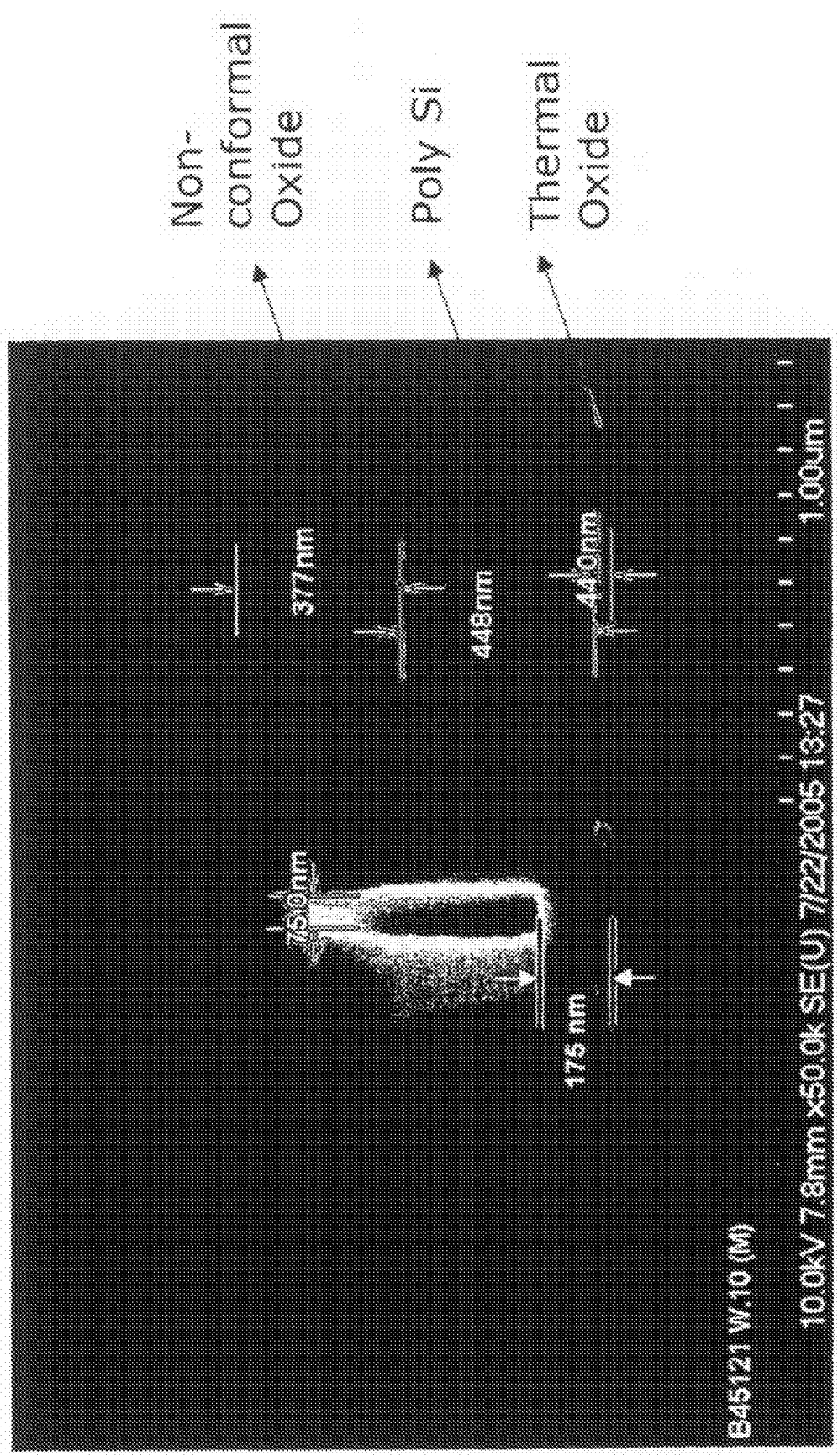
FIG. 11 shows a SEM (Scanning Electron Microscopy) image of a first stage of a preliminary experiment according to the present invention.

An approximately 400 nm poly layer was deposited and dry-etched on top of an approximately 50 nm thermal oxide layer so as to form a trench of about 0.4 µm width to imitate the emitter window. This was followed by a BOE (buffered oxide wet etch) removal of the bottom oxide layer, followed by the intentionally non-conformal oxide deposition (SILOX CVD technique, using $SiH_4$ and $N_2O$ as reactants). The non-conformality (thickness ratio of oxide outside to inside emitter window) attained was more than 200%, with a target thickness near 400 nm for the SILOX CVD. This stage of the process is shown in FIG. 11.

Figure 12:
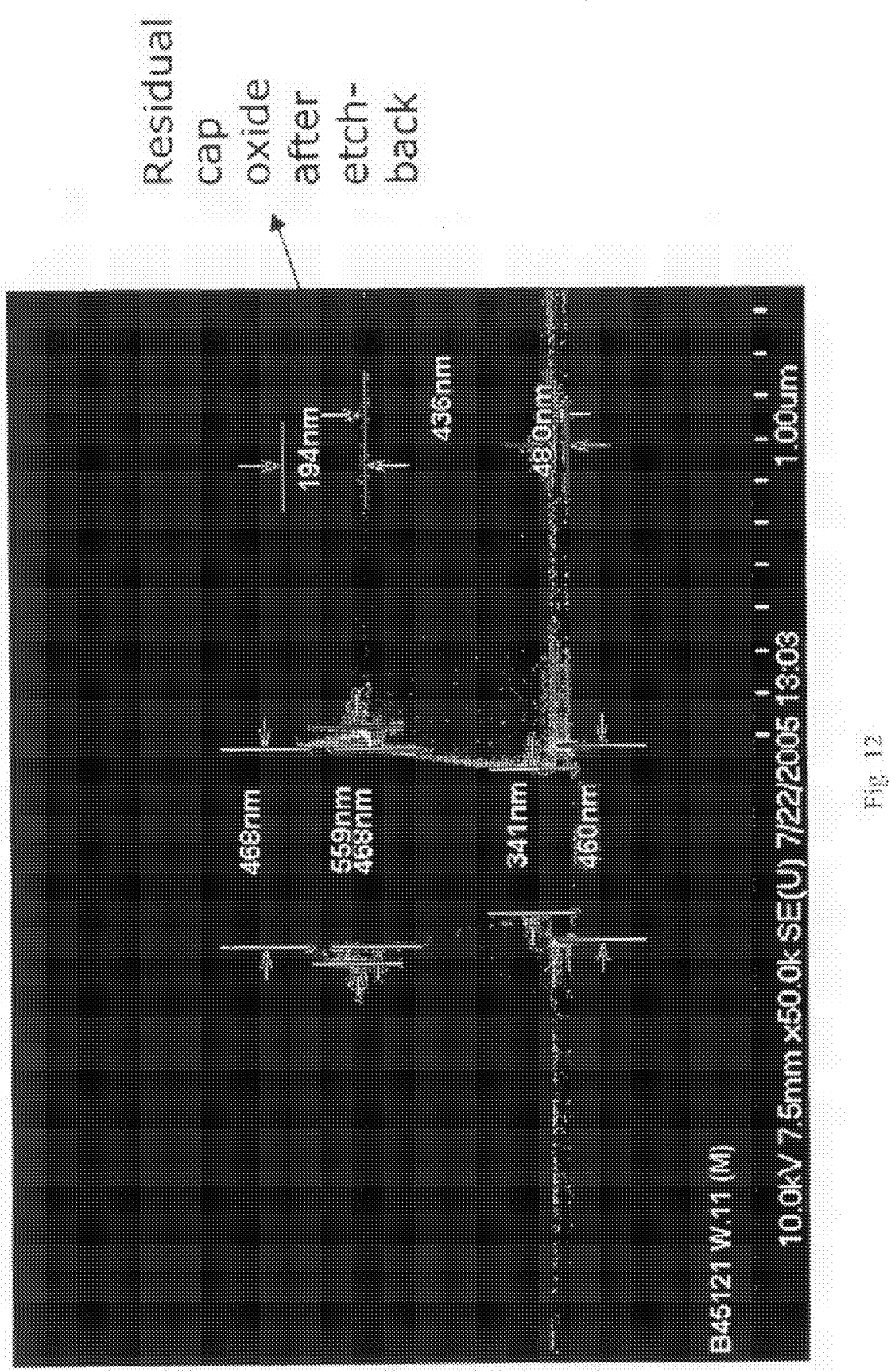
FIG. 12 shows a SEM image of a second stage of the preliminary experiment of FIG. 11.

Subsequently a BOE wet etch-back was carried out, as a result of which a cap layer still as thick as 190 nm SILOX CVD was remaining on top of the poly outside the window while no oxide was left inside the window, as shown in FIG. 12.

Although the invention has been described in terms of preferred embodiments as set forth above, it should be understood that these embodiments are illustrative only and that the claims are not limited to those embodiments. Those skilled in the art will be able to make modifications and alternatives in view of the disclosure which are contemplated as falling within the scope of the appended claims. Each feature disclosed or illustrated in the present specification may be incorporated in the invention, whether alone or in any appropriate combination with any other feature disclosed or illustrated herein.

What is claimed:

1. A method of forming an oxide layer on material defining and surrounding an emitter window, comprising:
    depositing a non-conformal oxide layer on said material defining and surrounding said emitter window and in said emitter window, whereby the thickness of at least a portion of the oxide layer in the emitter window is smaller than the thickness of the oxide layer on said material defining and surrounding said emitter window; and
    removing at least a portion of said oxide layer in said emitter window so as to reveal at least a portion of the bottom of said emitter window whilst permitting at least a portion of said oxide layer to remain on said material defining and surrounding said emitter window.

2. A method according to claim 1, wherein after deposition of the oxide layer the thickness of the oxide layer over at least a portion of the bottom of the emitter window is smaller than the thickness of the oxide layer on said surrounding material.

3. A method according to claim 2, wherein the thickness of the oxide layer over substantially the entire bottom of the emitter window is smaller than the thickness of the oxide layer on said surrounding material.

4. A method according to claim 1, wherein after deposition of the oxide layer the thickness of the oxide layer on said surrounding material is 50 to 300% greater than the thickness of the oxide layer over said portion of the bottom of the emitter window.

5. A method according to claim 1, wherein the thickness of the oxide layer over said portion of the bottom of the emitter window is between 50 and 150 nm.

6. A method according to claim 1, wherein after deposition of the oxide layer the thickness of the oxide layer on said surrounding material is between 200 and 300 nm.

7. A method according to claim 1, wherein after removal of said portion of said oxide layer in said emitter window the thickness of the oxide layer remaining on said surrounding material is at least 50 nm.

8. A method according claim 1, wherein removing at least said portion of said oxide layer in the emitter window comprises etching said oxide layer.

9. A method according to claim 1, further comprising forming at least one nitride side wall spacer in said emitter window.

10. A method according to claim 9, comprising forming two nitride side wall spacers in said emitter window, and wherein removing at least said portion of said oxide layer in said emitter window comprises removing substantially all of said oxide layer over an area of said bottom of said emitter window which is not covered by said nitride side wall spacers.

11. A method according to claim 1, further comprising forming at least a portion of an emitter in said emitter window.

12. A method according to claim 1, wherein said oxide layer comprises a silicon oxide layer.

13. A method according to claim 1, comprising also removing a portion of the oxide layer on said surrounding material at substantially the same rate at which the oxide layer in said emitter window is removed.

14. A method according to claim 1 wherein said depositing and removing steps are carried out to manufacture a bipolar junction transistor or a hetero junction bipolar transistor.

15. A semiconductor processing apparatus for forming an oxide layer on material defining and surrounding an emitter window, comprising:
  a depositor configured to deposit a non-conformal oxide layer on said material defining and surrounding said emitter window and in said emitter window, whereby the thickness of at least a portion of the oxide layer in the emitter window is smaller than the thickness of the oxide layer on said material defining and surrounding said emitter window; and
  a remover configured to remove at least a portion of said oxide layer in said emitter window so as to reveal at least a portion of the bottom of said emitter window whilst permitting at least a portion of said oxide layer to remain on said material defining and surrounding said emitter window.

16. A method according to claim 1, wherein the material on which the non-conformal oxide layer is deposited in the emitter window is the same as the material on which the non-conformal layer is deposited on the surrounding material.

17. A method according to claim 1, further comprising growing a passivation layer in the emitter window and the surrounding material prior to the step of depositing the non-conformal oxide layer.

\* \* \* \* \*